(12) United States Patent
Zhu et al.

(10) Patent No.: US 8,031,819 B2
(45) Date of Patent: Oct. 4, 2011

(54) SYSTEMS AND METHODS FOR SYNCHRONIZING AN INPUT SIGNAL

(75) Inventors: Zhubiao Zhu, Fort Collins, CO (US); Carson Donahue Henrion, Fort Collins, CO (US); Daniel Alan Berkram, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1350 days.

(21) Appl. No.: 11/588,459

(22) Filed: Oct. 27, 2006

(65) Prior Publication Data

US 2008/0101513 A1 May 1, 2008

(51) Int. Cl.
*H04L 7/00* (2006.01)
(52) U.S. Cl. ........ 375/354; 375/356; 375/355; 375/220; 375/360; 375/376
(58) Field of Classification Search .................. 375/354, 375/356, 355, 220, 360, 376
See application file for complete search history.

(56) References Cited

U.S. PATENT DOCUMENTS

| | | | |
|---|---|---|---|
| 4,949,360 A | 8/1990 | Martin | |
| 5,418,407 A * | 5/1995 | Frenkil | 327/163 |
| 5,487,163 A * | 1/1996 | Keeley | 713/401 |
| 5,522,048 A | 5/1996 | Offord | |
| 5,671,258 A | 9/1997 | Burns et al. | |
| 6,152,613 A | 11/2000 | Martin et al. | |
| 6,205,191 B1 | 3/2001 | Portmann et al. | |
| 6,507,915 B1 * | 1/2003 | Franca-Neto | 713/401 |
| 6,594,326 B1 | 7/2003 | Portmann et al. | |
| 6,690,221 B1 | 2/2004 | Chang | |
| 6,756,819 B2 | 6/2004 | Aikawa | |
| 6,906,555 B2 | 6/2005 | Ma | |
| 6,960,941 B2 | 11/2005 | Cantin et al. | |
| 6,985,547 B2 * | 1/2006 | Uht | 375/354 |
| 7,072,821 B1 * | 7/2006 | Manz et al. | 703/19 |
| 7,075,336 B2 | 7/2006 | Kojima et al. | |
| 7,076,682 B2 | 7/2006 | Jacobson | |
| 2004/0151209 A1 | 8/2004 | Cummings et al. | |
| 2005/0206416 A1 | 9/2005 | Kizer | |

* cited by examiner

*Primary Examiner* — Kabir A Timory

(57) ABSTRACT

Systems and methods for synchronizing an input signal with a substantial mitigation of race conditions and a substantial increase in resolving time are provided. One embodiment includes a system comprising a first latching device configured to latch a first output signal from the input signal and a delay element configured to receive the first output signal and output a delay signal that is a delayed version of the first output signal. The system also includes a pass-gate element configured to receive the first output signal and to output a second output signal in response to a logic state of the delay signal. The second output signal has a delayed input edge without a delayed resolving edge. The system can be configured to force the first output signal to a stable logic state in response to the first output signal having a metastable state.

19 Claims, 6 Drawing Sheets

SYSTEMS AND METHODS FOR SYNCHRONIZING AN INPUT SIGNAL

BACKGROUND

Synchronization can involve latching a signal from a first clock domain to a second clock domain. In certain applications, the second clock domain is not aligned to the first clock domain. As a result, the signal in the first clock domain can change state during a setup or a hold time, which can result in the latched signal in the second clock domain having a metastable condition. A metastable signal is neither a stable logic 0 nor a stable logic 1, and can thus potentially cause a critical system failure.

A common equation for a synchronizer can be expressed as:

$$\text{MTBF} = e^{(Tr/\tau)}/(2 \ast f_{DATA} \ast f_{CLOCK} \ast T_O) \quad \text{Equation 1}$$

Where:
- MTBF=Mean Time Between Failures
- Tr=Metastability Resolving Time
- τ=Resolution Rate
- $2 \ast f_{DATA}$=Incoming Edge Rate
- $f_{CLOCK}$=Clock Frequency
- $T_O$=Metastability Aperture The Metastability Resolving Time Tr can be a time that is associated with the time available for a metastable condition to resolve itself. It can generally be expressed as a clock period minus a setup delay and propagation delays of any intermediate logic. In addition, for a multiple stage synchronizer, Tr can be the total resolving time of all the stages. The Metastability Aperture $T_O$ is a constant related to a width of time window during which an input transition will cause a metastability event. The Resolution Rate τ and the Metastability Aperture $T_O$ can both be experimentally measured.

Delay can be added in synchronization applications to prevent a race condition, in which an output of a first latching device from racing to a subsequent latching device. Despite the effectiveness of a pulse latch in a high frequency application due to its simplicity, a race condition can be especially severe in a pulsed latch based on process variations related to pulse width. A race condition can be mitigated by introducing a delay into the latching of a subsequent stage. However, in high frequency applications, the delay can consume a significant portion of the clock cycle, leaving less time to resolve the metastable condition (i.e., Metastable Resolving Time Tr). Due to the exponential relationship between the Metastable Resolving Time Tr and the MTBF, a reduction of Tr can severely increase a rate of failure.

DETAILED DESCRIPTION

Systems and methods are disclosed for increasing a Metastable Resolving Time Tr and for substantially mitigating a race condition in a high frequency signal synchronization system. A latched signal is delayed to mitigate a race condition. The delayed signal is forced from a metastable state to a stable logic state to activate a pass-gate element to pass a resolved latched signal, such that a resolving edge of the metastable state is not delayed. As such, a resolving edge for resolving to either a logic 0 state or a logic 1 state does not appear in the delayed signal, resulting in an increase in a Metastable Resolving Time Tr associated with the synchronization system.

Figure 1A:
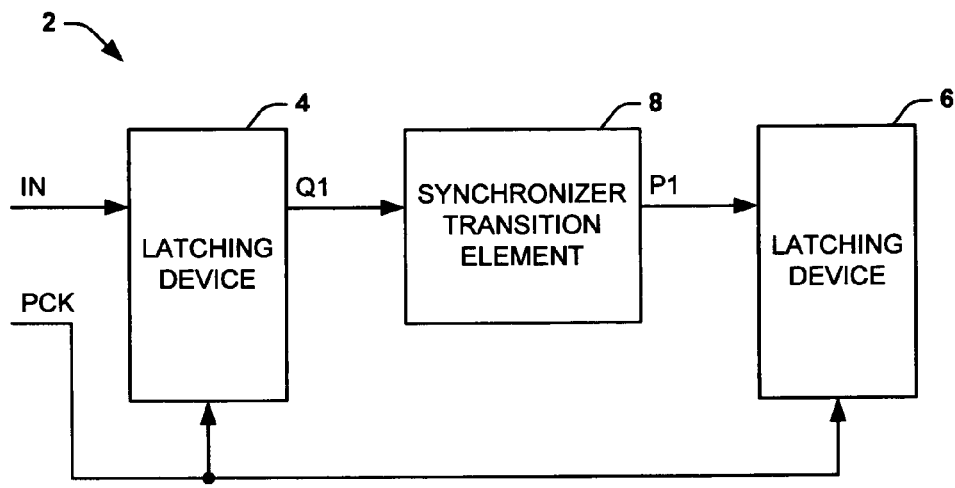
FIG. 1A depicts an example embodiment of a system for synchronizing an input signal.

FIG. 1A depicts an example embodiment of a system 2 for synchronizing an input signal. The system 2 can be a system for synchronizing an input signal from a first clock domain to a second clock domain. The system 2 includes a first latching device 4 that receives an input signal IN and a clock signal PCK as inputs. The clock signal PCK can be a pulsed clock signal, such that the pulsed clock signal has a substantially shorter logic high time relative to a logic low time. The input signal IN can be a signal that is asynchronous to the clock signal PCK, such that the input signal IN is not synchronized to the clock signal PCK. The first latching device 4 can be configured to latch the input signal IN based on a positive pulse of the clock signal PCK to provide a first output signal Q1. For example, the input signal IN can be latched by the first latching device 4 in response to a positive pulse of the clock signal PCK. As such, the first latching device 4 could operate in the example of FIG. 1A as a pulsed latch. However, it is to be understood that, in the example of FIG. 1A, the first latching device 4 is not limited to being a pulsed latch, but could instead be a type of flip-flop or latch device.

The system 2 also includes a second latching device 6 configured to latch a signal P1 based on a positive pulse of the clock signal PCK. Upon latching the input signal IN, the first latching device 4 could provide an output signal Q1 that is in a metastable state. For example, upon the input signal IN changing state during a setup time or a hold time, the output signal Q1 could have a state that is metastable, such that it is neither a logic 1 nor a logic 0.

The output signal Q1 can be input to a synchronizer transition element 8. The synchronizer transition element 8 can be configured to delay the output signal Q1 to substantially mitigate race conditions. In addition, the synchronizer transition element 8 can be further configured to not delay a resolving edge of a metastable condition of the output signal Q1. As such, the synchronizer transition element 8 can substantially increase the resolving time associated with the synchronization of the system 2. As will be provided in greater detail below, the synchronizer transition element 8 can include a delay device and a pass-gate element that provides a delay signal, the delay signal being a delayed version of the output signal Q1 that is forced to a stable logic state. The delay signal activates the pass-gate element, such that the pass-gate element switches the output signal Q1 to provide the signal P1.

Figure 1B:
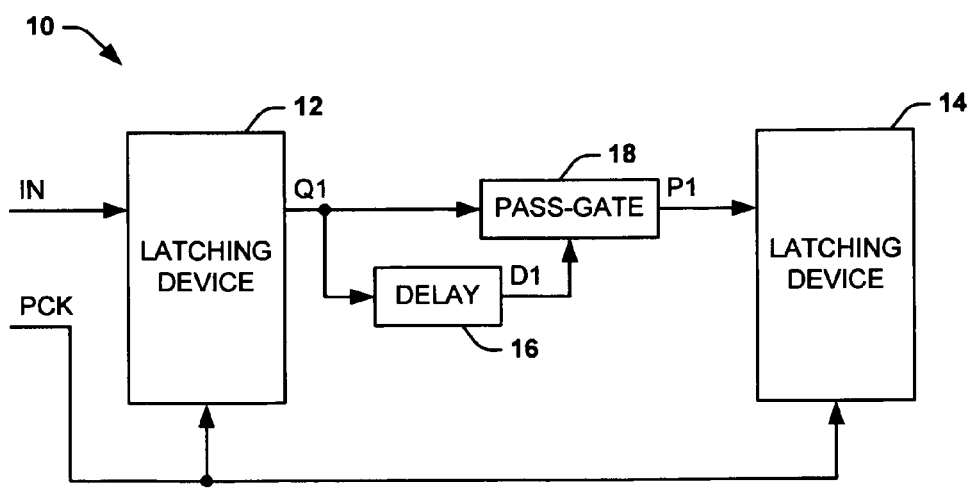
FIG. 1B depicts another example embodiment of a system for synchronizing an input signal.

FIG. 1B depicts another example embodiment of a system 10 for synchronizing an input signal. The system 10 can be a system for synchronizing an input signal from a first clock domain to a second clock domain. The system 10 includes a first latching device 12 that receives an input signal IN and a clock signal PCK as inputs. The clock signal PCK can be a pulsed clock signal, such that the pulsed clock signal has a substantially shorter logic high time relative to a logic low time. The input signal IN can be a signal that is asynchronous to the clock signal PCK, such that the input signal IN is not synchronized to the clock signal PCK. The first latching device 12 can be configured to latch the input signal IN based on a positive pulse of the clock signal PCK to provide a first output signal Q1. For example, the input signal IN can be latched by the first latching device 12 in response to a positive pulse of the clock signal PCK. As such, the first latching device 12 could operate in the example of FIG. 1B as a pulsed latch. However, it is to be understood that, in the example of FIG. 1B, the first latching device 12 is not limited to being a pulsed latch, but could instead be a type of flip-flop or latch device.

The system 10 also includes a second latching device 14 configured to latch the signal that is output from the first latching device 12 based on a positive pulse of the clock signal PCK. Upon latching the input signal IN, the first latching device 12 could provide an output signal Q1 that is in a metastable state. For example, upon the input signal IN changing state during a setup time or a hold time, the first output signal Q1 could have a state that is metastable, such that it is neither a logic 1 nor a logic 0.

The first output signal Q1 can be input to a delay element 16 and a pass-gate element 18. The delay element 16 provides a delay signal D1 that is a delayed version of the first output signal Q1. The delay element 16 could include an arrangement of gates and/or switching devices configured to delay a change of state of the first output signal Q1 to provide the delay signal D1. As an example, the delay element 16 could include an even number plurality of inverters, or any other arrangement of gates that results in the delay signal D1 having the same state as the first output signal Q1 but delayed based on the amount of time to pass the signal through the gates. As another example, as will be demonstrated in greater detail in the example of FIG. 5 below, the delay element 16 could delay the first output signal Q1 by different amounts of time based on the logic state of the first output signal Q1.

In addition, the delay element 16 can be configured to perform a voltage level conversion function, such that the delay element 16 can output the delay signal D1 having a stable logic state upon the first output signal Q1 having a metastable state. For example, the delay element can include one or more inverters that include an N-type field effect transistor (FET) and a P-FET having dissimilar activation strengths. For example, an inverter can include a strong P-FET relative to a weak N-FET, such that a metastable input signal is more likely to be forced to a logic 1 output state. As another example, an inverter can include a weak P-FET relative to a strong N-FET, such that a metastable input signal is more likely to be forced to a logic 0 output state. By including one or more of such inverters, the delay element 16 can be configured to force the delay signal D1 to a specific stable logic state upon receiving a metastable input.

The specific stable logic state to which the delay signal D1 is forced can be dependent on the initial logic state of the first output signal Q1 prior to a transition to a metastable state. For example, the delay element 16 can be configured to force the delay signal D1 to a stable logic 1 state upon the first output signal Q1 being switched from a logic 0 state to a metastable state. As another example, the delay element 16 can be configured to force the delay signal D1 to a stable logic 0 state upon the first output signal Q1 being switched from a logic 1 state to a metastable state. Because the configuration of the delay element 16 may be specific to operate for a specific initial state of the first output signal Q1, the first latching device 12 may be configured with complementary channels, such that both a rising edge and a falling edge of the input signal IN can be latched, as demonstrated in greater detail in the example of FIG. 6 below.

The pass-gate element 18 receives the first output signal Q1 and provides a second output signal P1 in response to the delay signal D1 activating the pass-gate element 18. As an example, the pass-gate element 18 can include an arrangement of transistors configured to propagate the logic state of the first output signal Q1 to the second output signal P1 upon being activated by the delay signal D1. Furthermore, the pass-gate element 18 can be configured to propagate the logic state of the first output signal Q1 to the second output signal P1 based on a logic 1 state of the delay signal D1. In one example arrangement, the pass-gate element can include an N-FET coupled in parallel to a P-FET, such that the N-FET and the P-FET each have a source terminal coupled together and a drain terminal coupled together. In this example, the N-FET and the P-FET can each be activated by a combination of the delay signal D1 and an inverted version of the delay signal D1, depending on the desired stable logic state to which the delay signal D1 is forced.

As described above, the first latching device 12 could provide an output signal Q1 that has a metastable state. The metastable state of the first output signal Q1 could be resolved over a given period of time, such that it eventually achieves a stable condition. However, since the delay element 16 can convert the metastable state of the first output signal Q1 to a delay signal having a stable logic state, the pass-gate element 18 can be activated to propagate the state of the first output signal Q1 to the second output signal P1 at a time when the first output signal Q1 is substantially stable. Thus, the second latching device 14 can subsequently latch a substantially stable second output signal P1. Therefore, the delay element 16 and the pass-gate element 18 are collectively configured to delay the latching of the second output signal P1 to substantially mitigate undesirable race conditions without delaying the resolving edge of a metastable condition. As such, the second latching device 14 can latch a substantially stable delayed signal that does not have a resolving edge for resolving to either a logic 0 state or a logic 1 state. Accordingly, the system 10 has an increased Metastable Resolving Time Tr.

It is to be understood that the system 10 is not intended to be limited by the example of FIG. 1B. For example, other synchronization configurations can be utilized in the system 10. As an example, the first latching device 12 and the second latching device 14 could be condition controlled latches and/or flip-flops. As another example, the first latching device 12 can include one or more output inverters including an N-FET and P-FET pair having dissimilar activation strengths, instead of or in addition to such a configuration in the delay element 16, such that the first output signal Q1 can be output from the first latching device 12 as having been forced from a metastable state to a substantially stable state. Furthermore, additional logic circuitry can be included in the system 10, such that the additional logic circuitry works in conjunction with the synchronization of the input signal IN. As such, any of a variety of other combinations of logic devices can be included in the example of FIG. 1B.

Figure 2:
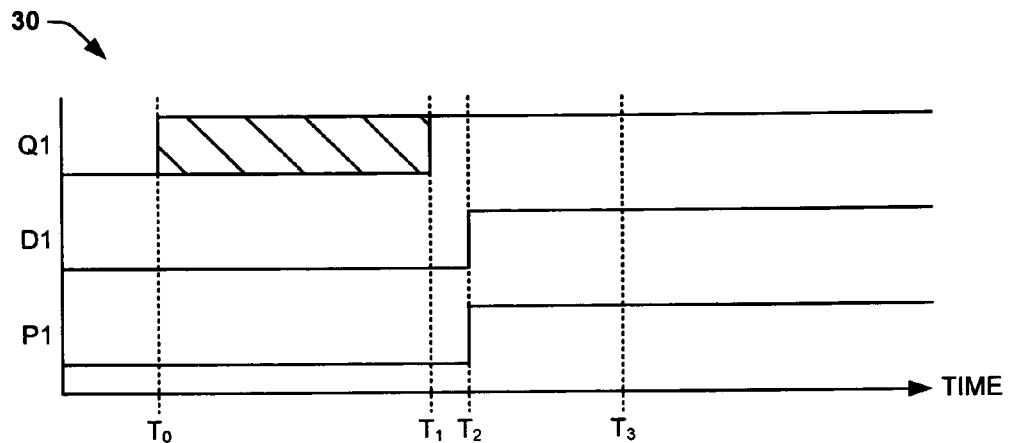
FIG. 2 depicts an example embodiment of a timing diagram that illustrates synchronizing an input rising signal with a metastable state resolving to a logic 1 state.

FIG. 2 depicts an example of a timing diagram 30 that illustrates the synchronizing of an input signal on a rising edge transition. The timing diagram 30 can represent a timing diagram for the system 10 in the example of FIG. 1B. As such, in the discussion of FIG. 2, reference will be made to the example of FIG. 1B. The timing diagram 30 demonstrates the first output signal Q1, the delay signal D1, and the second output signal P1 as a function of time. At a time $T_0$, the first output signal transitions from a logic 0 state to a metastable logic state, such that it is neither logic 1 nor logic 0. At a time $T_1$, the timing diagram 30 demonstrates a resolving edge of the metastable condition, as the first output signal Q1 resolves to a logic 1 state.

As described above in the example of FIG. 1B, the delay signal D1 can be a delayed version of the first output signal Q1 that can force a metastable state to a logic 1 state. As such, at a time $T_2$, the delay signal D1 can transition from a logic 0 state to a logic 1 state. As demonstrated in the timing diagram 30, the transition to the logic 1 state can occur subsequent to the first output signal Q1 resolving at the time $T_1$. Therefore, at the time $T_2$, the delay signal D1 can activate the pass-gate element 18, thus switching the logic state of the first output signal Q1 to the second output signal P1. Accordingly, at the time $T_2$, the second output signal P1 switches from a logic 0 to a logic 1 state. Because the first output signal Q1 is at a stable state at the time $T_2$, the second output signal P1 is also at a stable state at the time $T_2$. Thus, at a subsequent time $T_3$, the second latching device 14 can latch the second output signal P1 without further propagating an undesirable metastable state. Therefore, the latching of the second output signal P1 by the second latching device 14 is delayed to mitigate undesirable race conditions without delaying the resolving edge of the metastable condition. Accordingly, the second output signal P1 is delayed but does not include a resolving edge for resolving to the logic 1 state, thus increasing the Metastable Resolving Time Tr of the associated synchronizer.

Figure 3:
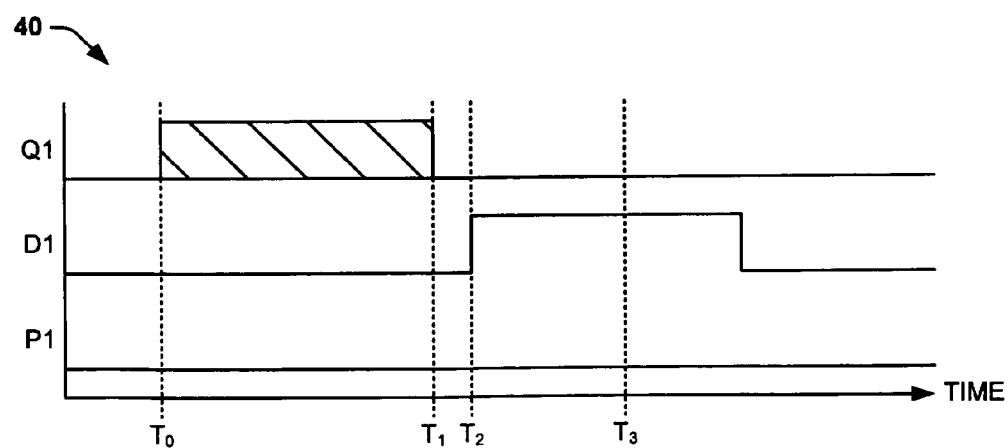
FIG. 3 depicts another example embodiment of a timing diagram that illustrates synchronizing an input rising signal with a metastable state resolving to a logic 0 state.

FIG. 3 depicts another example of a timing diagram 40 that illustrates the synchronizing of an input signal. In the example of FIG. 3, the timing diagram 40 depicts a synchronization of an input signal that is switched in a logic 0 state. Similar to the timing diagram 30 in the example of FIG. 2, the timing diagram 40 can represent a timing diagram for the system 10 in the example of FIG. 1B. As such, in the discussion of FIG. 3, reference will be made to the example of FIG. 1B. The timing diagram 40 demonstrates the first output signal Q1, the delay signal D1, and the second output signal P1 as a function of time. At a time $T_0$, the first output signal transitions from a logic 0 state to a metastable logic state, such that it is neither logic 1 nor logic 0. At a time $T_1$, the timing diagram 40 demonstrates a resolving edge of the metastable condition, as the first output signal Q1 resolves to a logic 0 state.

Similar to as described above in the example of FIG. 2, at a time $T_2$, the delay signal D1 can transition from a logic 0 state to a logic 1 state. As demonstrated in the timing diagram 40, the transition to the logic 1 state can occur subsequent to the first output signal Q1 resolving at the time $T_1$. Therefore, at the time $T_2$, the logic state of the first output signal Q1 can be switched to the second output signal P1. Accordingly, at the time $T_2$, the second output signal P1 maintains a logic 0 state. Because the first output signal Q1 is at a stable state at the time $T_2$, the second output signal P1 is also at a stable state at the time $T_2$. Thus, at a subsequent time $T_3$, the second latching device 14 can latch the second output signal P1 without further propagating an undesirable metastable state. Therefore, the latching of the second output signal P1 by the second latching device 14 is delayed to mitigate undesirable race conditions without delaying the resolving edge of the metastable condition. Accordingly, the second output signal P1 is delayed but does not include a resolving edge for resolving to the logic 0 state, thus increasing the Metastable Resolving Time Tr of the associated synchronizer.

The examples of FIGS. 2 and 3, in combination with the example of FIG. 1B, demonstrate that a race condition can be substantially mitigated between latching devices, such as from the first latching device 12 to the second latching device 14. The logic state of the first output signal Q1 cannot propagate to the second output signal P1 until the pass-gate element 18 is activated, demonstrated at the time $T_2$. The activation of the pass-gate element 18 is controlled by the amount of delay of the delay element 16, which is demonstrated in both the example of FIG. 2 and the example of FIG. 3 as the difference in time between the time $T_2$ and the time $T_0$.

In addition to demonstrating substantial mitigation of a race condition, the examples of FIGS. 1-3 also demonstrate a system having a longer Metastable Resolving Time Tr. The first output signal P1 is demonstrated in the examples of FIGS. 2 and 3 as having a stable logic state after the time $T_2$. The forced logic state of the delay signal D1, demonstrated as a stable logic 1 state, can be sufficient to activate the pass-gate element 18 at the time T2. As the resolving edge of the metastable state of the first output signal Q1; occurring at the time T1, can occur prior to the activation of the pass-gate element 18, the first output signal Q1 can be latched as a substantially stable second output signal P1. As such, the first output signal Q1 can be delayed as it is passed from the first latching device 12 to the second latching device 14 without delaying the resolving edge. Thus, the metastable state of the first output signal Q1 is not delayed by the delay element, resulting in a delayed second output signal P1 that does not have a resolving edge for resolving to either a logic 0 state or a logic 1 state. Thus, the examples of FIGS. 1-3 demonstrate a system having a longer Metastable Resolving Time Tr.

It is to be understood that; in the examples of FIGS. 2 and 3, the associated delay element 16 is configured to force a metastable state to a logic 1 based on the initial state of the first input signal Q1 being logic 0 (e.g., rising edge). Thus, the timing diagrams 30 and 40 demonstrate the operation of a system 10 that is effective for latching signals having an initial state of logic 0. It is to be understood that a delay element 16 can instead be configured to force a metastable state to a logic 0 based on the initial state of the first input signal Q1 being logic 1 (e.g., falling edge), such as for a system 10 that is effective for latching signals having an initial state of logic 1. Therefore, it is to be understood that the logic states demonstrated in the timing diagrams 30 and 40 in the examples of FIGS. 2 and 3, respectively, could merely be reversed to demonstrate example timing diagrams of such a system 10.

Figure 4:
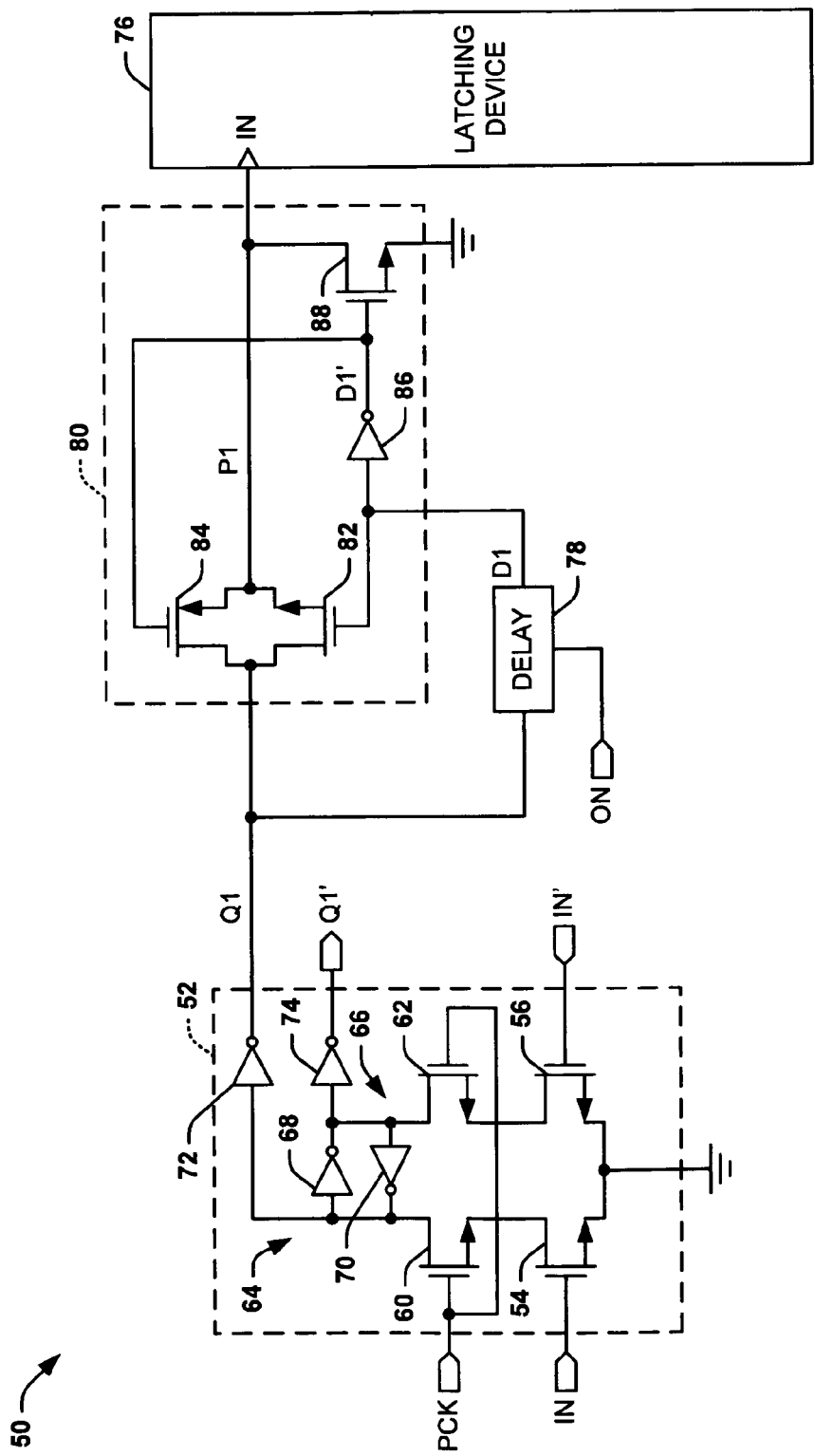
FIG. 4 depicts another example embodiment of a system for synchronizing a rising edge input signal.

FIG. 4 depicts another example of a system 50 for synchronizing an input signal. The system 50 can be a system for synchronizing a signal from one clock domain to another. The system 50 includes a pulsed latch 52. As described in greater detail below, the pulsed latch 52 can be configured to latch an input signal IN based on a pulse of a pulsed clock signal PCK to provide a first output signal Q1. As such, the pulsed latch can operate similar to the first latching device 12 described above in the example of FIG. 1B.

In the example of FIG. 4, the pulsed latch 52 includes an N-FET 54 and an N-FET 56 that respectively receive the input signal IN and a complement of the input signal IN' as inputs at respective gate terminals. The N-FET 54 and the N-FET 56 interconnect a negative supply voltage rail, demonstrated in the example of FIG. 4 as ground, and source terminals of an N-FET 60 and an N-FET 62. The N-FET 60 has a drain terminal coupled to a storage node 64 and the N-FET 62 has a drain terminal coupled to a storage node 66. The N-FET 60 and the N-FET 62 each receive the pulsed clock signal PCK as inputs at respective gate terminals. The storage nodes 64 and 66 are interconnected by a pair of opposing inverters 68 and 70 that are configured to set the logic states of the storage nodes 64 and 66 opposite of each other, regardless of the logic state of the input signal IN.

The pulsed latch 52 also includes an inverter 72 that interconnects the storage node 64 to the first output signal Q1, and an inverter 74 that interconnects the storage node 66 to a complement of the first output signal Q1'. As such, for example, upon the input signal IN being logic 1, and at a positive pulse of the pulsed clock signal PCK, the N-FETs 54 and 60 are activated to couple the storage node 64 to ground, resulting in the first output signal Q1 having a logic 1 state with the complement of the first output signal Q1' having a logic 0 state. Upon the input signal IN being logic 0 and at a positive pulse of the pulsed clock signal PCK, the N-FETs 56 and 62 are activated to couple the storage node 66 to ground, resulting in the first output signal Q1 having a logic 0 state with the complement of the first output signal Q1' having a logic 1 state. In the example of FIG. 4, the complement of the first output signal Q1' is demonstrated as not being coupled to any other device. However, it is to be understood that the complement of the first output signal Q1' can be implemented for a variety of purposes.

The system 50 also includes a latching device 76 configured to latch the signal that is output from the pulsed latch 52. The latching device 76 could be a pulsed latch similar to the pulsed latch 52. For example, the latching device 76 can latch the signal that is output from the pulsed latch 52 based on a positive pulse of the pulsed clock signal PCK. Upon latching the input signal IN, the first output signal Q1 could have a metastable state.

The first output signal Q1 can be input to a delay element 78 and a pass-gate element 80. The delay element 78 provides a delay signal D1, the delay signal D1 being a delayed version of the first output signal Q1. The delay element 78 could include an arrangement of gates and/or switching devices configured to delay a change of state of the first output signal Q1 to provide the delay signal D1. In the example of FIG. 4, the delay element 78 can be configured to force the delay signal D1 to a stable logic 1 state upon a transition from a logic 0 state to a metastable state of the first output signal Q1. For example, the delay element 78 can include one or more inverters having an N-FET and P-FET pair with dissimilar activation strengths. In addition, the delay element 78 can include an activation signal ON, such that a logic 0 state of the activation signal ON can result in a logic 0 state of the delay signal D1, regardless of the state of the first output signal Q1.

The pass-gate element 80 includes an N-FET 82 coupled in parallel to a P-FET 84, such that the N-FET 82 and the P-FET 84 each have a source terminal coupled together and a drain terminal coupled together. In the example of FIG. 4, the N-FET 82 has a gate terminal that is activated by the delay signal D1. The pass-gate element 80 also includes an inverter 86 configured to receive the delay signal D1 and to provide an inverted delay signal D1'. The P-FET 84 has a gate terminal that is activated by the inverted delay signal D1'.

The first output signal Q1 is input to the pass-gate element 80 at the coupled drain terminals of the N-FET 82 and the P-FET 84. The pass-gate element 80 provides a second output signal P1 in response to the delay signal D1 and/or the inverted delay signal D1'. As described above, the delay element 78 can force the delay signal D1 to a logic 1 state upon the output signal Q1 having a metastable state. As such, the delay signal D1 can activate the N-FET 82 and/or the inverted delay signal D1' can activate the P-FET 84, respectively. At the time of activating the N-FET 82 and/or the P-FET 84 via the delay signal D1 and the inverted delay signal D1', respectively, the first output signal Q1 could be stable, such that it is no longer in a metastable state. As such, the latching device 76 can subsequently latch the second output signal P1 in a substantially stable state. Accordingly, because of the delay of the activation of the N-FET 82 and/or the P-FET 84 via the delay signal D1 and the inverted delay signal D1', respectively, undesirable race conditions are substantially mitigated without delaying the resolving edge of a metastable condition to the second output signal P1. As such, the second latching device 76 can latch a substantially stable signal that is delayed but does not include a resolving edge for resolving to either a logic 0 state or a logic 1 state. Accordingly, the Metastable Resolving Time Tr of the system 50 is increased.

The pass-gate element 80 also includes a second N-FET 88 that is interconnected between the second output signal P1 and ground. In the example of FIG. 4, the second N-FET 88 has a gate terminal that is coupled to the inverted delay signal D1'. As such, the second N-FET 88, which can be configured as a weak N-FET, is configured to sink the second output signal P1 to ground upon a logic 1 state of the inverted delay signal D1, and thus a logic 0 state of the delay signal D1. As described above, the delay element 78 can force the delay signal D1 to a logic 1 state upon the first output signal Q1 having a metastable state. However, upon the first output signal Q1 not having a metastable state, the delay element 78 can output the delay signal D1 as a delayed version of the first output signal Q1 having either a stable logic 1 or a stable logic 0 state. Thus, for example, upon the delay signal having a stable logic 1 state that is a delayed version of a logic 1 state of the first output signal Q1, the N-FET 82 and/or the P-FET 84 are activated to pass the logic 1 state of the first output signal Q1 to the second output signal P1. As another example, upon the delay signal having a logic 0 state that is a delayed version of a logic 0 state of the first output signal Q1, the second N-FET 88 activates to sink the second output signal P1 to ground, resulting in a logic 0 state of the second output signal P1 and thus mitigating floating voltage potentials of the second output signal P1.

It is to be understood that the system 50 is not intended to be limited by the example of FIG. 4. As described above, the delay element 78 is configured in the example of FIG. 4 to force the delay signal D1 to a stable logic 1 state upon a transition from a logic 0 state to a metastable state of the first output signal Q1. However, it is to be understood that the delay element 78 can instead be configured to force the delay signal D1 to a stable logic 0 state upon a transition from a logic 1 state to a metastable state of the first output signal Q1. In this example, the delay signal D1 could be coupled instead to the gate terminal of the P-FET 84 and the inverted delay signal D1' could be coupled instead to the gate terminal of the N-FET 82. Likewise in this example, the N-FET 88 in the example of FIG. 4 could instead be a P-FET configured to pull the second output signal P1 up to a positive voltage supply rail upon the delay signal providing a stable logic 1 delay signal D1.

In addition, other synchronization configurations can be utilized in the system 50. As an example, similar to as described above regarding the example of FIG. 1B, the pulsed latch 52 and the latching device 76 could be configured as condition controlled latches and/or flip-flops. As another example, either or both of the inverters 72 and 74 can include an N-FET and P-FET pair having dissimilar activation strengths, instead of or in addition to such a configuration in the delay element 78, such that the first output signal Q1 can be output from the first latching device 52 as having been forced from a metastable state in the respective storage nodes 64 and 66 to a substantially stable state. Furthermore, additional logic circuitry can be included in the system 50, such that the additional logic circuitry works in conjunction with the synchronization of the input signal IN. As such, any of a variety of other combinations of logic devices can be included in the example of FIG. 4.

Figure 5:
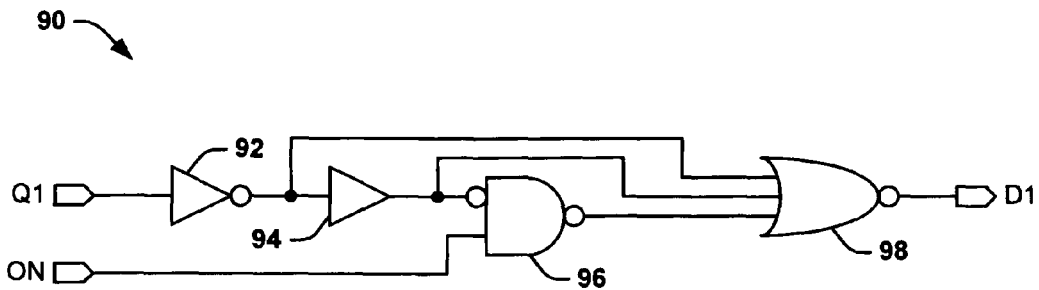
FIG. 5 depicts an example embodiment of a delay element in a system for synchronizing a rising edge input signal.

FIG. 5 depicts an example of a delay element 90 in a system for synchronizing an input signal. The delay element 90 can represent the delay element 78 in the example of FIG. 4. As such, in the discussion of FIG. 5, reference will be made to the example of FIG. 4. The delay element 90 includes an inverter 92, a buffer 94, a NAI gate 96 (i.e., a NAND gate having an inverting input terminal), and a NOR gate 98 substantially connected together in series. The first output signal Q1 is input to the inverter 92. The output of the inverter 92 is coupled to the input of the buffer 94, and is also provided as an input to the NOR gate 98. The output of the buffer 94 is coupled to the inverting input of the NAI gate 96, and is also provided to an input of the NOR gate 98. The NAI gate 96 also receives the activation signal ON as an input, and provides an output to the NOR gate 98. The output of the NOR gate 98 is the delay signal D1.

As described above, the delay element 90 can be configured to force a metastable state of the first output signal Q1 to a stable logic state. For example, the inverter 92 can include a strong N-FET relative to a weak P-FET, such that the stronger N-FET is substantially more likely to activate than the P-FET upon receiving a metastable input. As such, the inverter 92 can be more likely to output a logic 0 upon the first output signal Q1 having a metastable state, thus resulting in a delay signal D1 that has a stable logic 1 state.

In addition, the inverter 92 may not be a single inverter, but could include an odd number plurality of inverters, each with FETs of dissimilar activation strength. For example, a first inverter could have a strong N-FET relative to a weak P-FET, a second inverter could have a weak N-FET relative to a strong P-FET, and a third inverter could have a strong N-FET relative to a weak P-FET, similar to the first inverter. As such, the three inverters, in series, could be much more likely to convert a metastable signal to a stable logic 0 state than a single inverter with a strong N-FET and a weak P-FET. Furthermore, it is to be understood that the buffer 94 can additionally or alternatively include such an arrangement of N-FET and P-FET pairs having dissimilar activation strengths.

As described above, the delay element 90 can also result in the delay signal D1 having the same logic state as a stable state of the first output signal Q1, but delayed based on the amount of time to propagate through the gates. As an example, a transition of the first output signal Q1 from logic 0 to logic 1 is delayed through the transistor propagating through the inverter 92, the buffer 94, the NAI gate 96, and the NOR gate 98. However, due to the coupling of the output of the inverter 92 to the input of the NOR gate 98, a transition of the first output signal Q1 from logic 1 to logic 0 is delayed only through the transistor propagation through the inverter 92 and the NOR gate 98. As such, a transition of the first output signal Q1 from logic 1 to logic 0 bypasses the buffer 94 and the NAI gate 96. Therefore, the transition of the first output signal Q1 from logic 1 to logic 0 results in a delay signal D1 that is delayed by a smaller amount of time than a transition of the first output signal Q1 from logic 0 to logic 1. For this reason, the pass-gate element 80 can be quickly deactivated to sink the second output signal P1 to ground prior to the next cycle latching by the latching device 96.

As described above regarding the example of FIG. 4, the activation signal ON provides activation of the delay element 90. In the example of FIG. 5, while the activation signal ON is at a logic 1 state, the delay element 90 can provide a delayed logic 1 state at the delay signal D1 upon the first output signal Q1 having a logic 1 state. However, upon the activation signal ON being switched to a logic 0 state, the delay element 90 becomes deactivated based on the output of the NAI gate 96 having a state of logic 1. Thus, the delay signal D1 is switched to logic 0, regardless of the state of the first output signal Q1. As will be described below in the example of FIG. 6, the activation signal ON can be used in conjunction with other logic circuitry to periodically enable and disable the delay element 90.

It is to be understood that the delay element 90 is not limited to the example of FIG. 5. For example, a different arrangement of gates can be provided in the delay element 90 to provide a delay signal D1 that is a delayed version of the first output signal Q1. In addition, a different arrangement of gates and/or switches can be used to provide delay amounts that differ based on the logic transition of the first output signal Q1. For example, upon the delay element 90 being configured to provide a delay signal having a logic 0 state upon the first output signal Q1 having a metastable state, the delay element 90 can be configured to delay a logic 0 state by a greater amount than a logic 1 state. Furthermore, the activation signal ON can provide different functionality, or could be omitted altogether from the delay element 90 in the example of FIG. 5.

Figure 6:
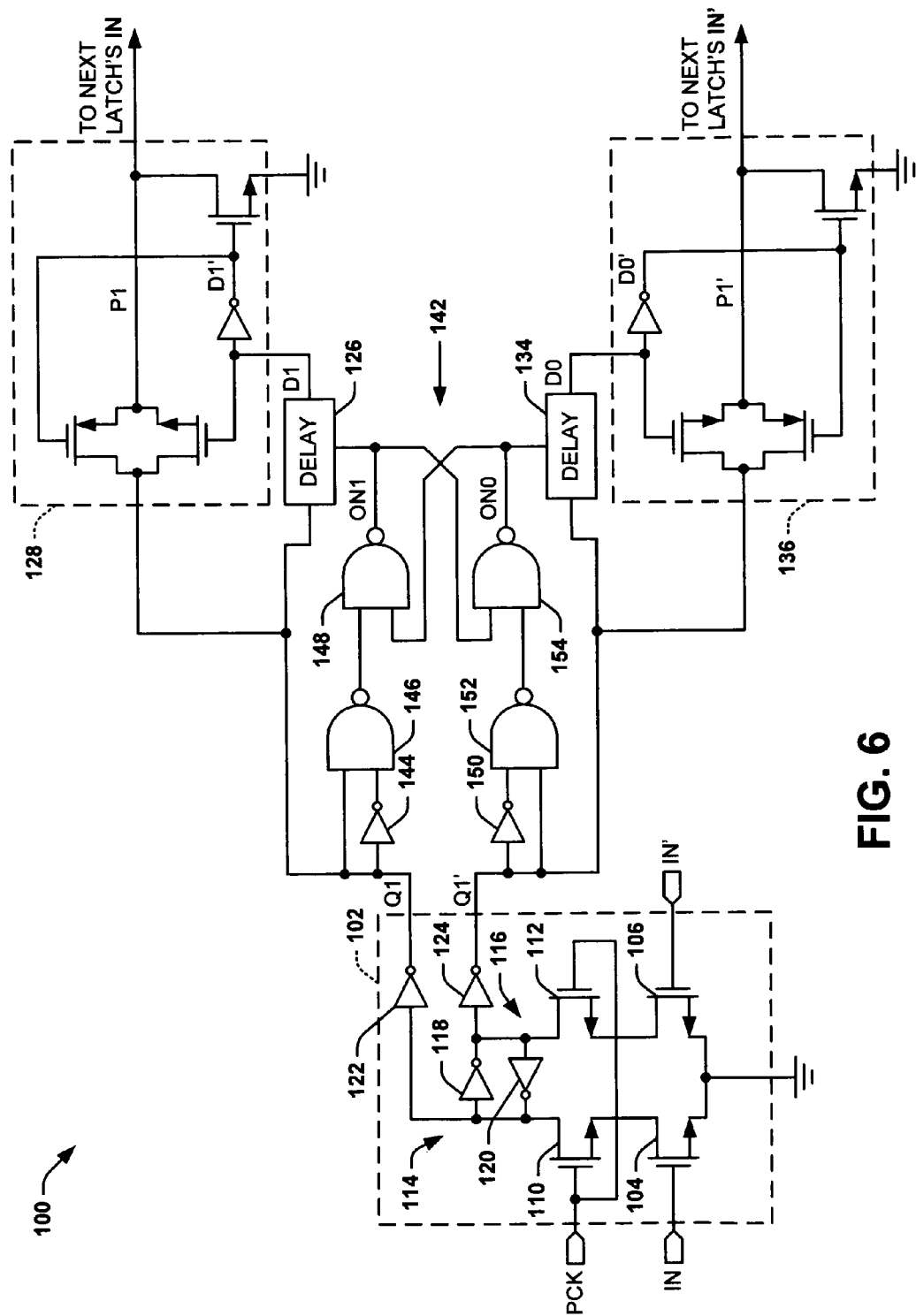
FIG. 6 depicts another example embodiment of a system for synchronizing a rising edge and a falling edge of an input signal.

FIG. 6 depicts another example of a system 100 for synchronizing an input signal. The system 100 can be a system for synchronizing a signal from one clock domain to another. For example, the system 100 can be a system for synchronizing both a rising edge of a signal and a falling edge of a signal to a clock domain. The system 100 includes a pulsed latch 102. The pulsed latch 102 receives an input signal IN and a clock signal PCK as inputs, similar to as described above in the examples of FIGS. 1 and 4. The pulsed latch 102 can be configured to latch the input signal IN based on a positive pulse of the clock signal PCK to provide a first output signal Q1 and an inverted first output signal Q1'. It is to be understood that the first output signal Q1 and the inverted first output signal Q1' are complements of each other. The system 100 can also include a second latching device (not shown) configured to latch both a second output signal P1 and an inverted second output signal P1' based on a positive pulse of the clock signal PCK, as demonstrated in greater detail below.

In the example of FIG. 6, the pulsed latch 102 includes an N-FET 104 and an N-FET 106 that respectively receive the input signal IN and a complement of the input signal IN' as inputs at respective gate terminals. The N-FET 104 and the N-FET 106 interconnect a negative supply voltage rail, demonstrated in the example of FIG. 6 as ground, and source terminals of an N-FET 110 and an N-FET 112. The N-FET 110 has a drain terminal coupled to a storage node 114 and the N-FET 112 has a drain terminal coupled to a storage node 116. The N-FET 110 and the N-FET 112 each receive the pulsed clock signal PCK as inputs at respective gate terminals. The storage nodes 114 and 116 are interconnected by a pair of opposing inverters 118 and 120 that are configured to set the logic states of the storage nodes 114 and 116 opposite of each other, regardless of the logic state of the input signal IN.

The pulsed latch 102 also includes an inverter 122 that interconnects the storage node 114 to the first output signal Q1, and an inverter 124 that interconnects the storage node 116 to a complement of the first output signal Q1'. As such, for example, upon the input signal IN being logic 1, and at a positive pulse of the pulsed clock signal PCK, the N-FETs 104 and 110 are activated to couple the storage node 114 to ground, resulting in the first output signal Q1 having a logic 1 state with the complement of the first output signal Q1' having a logic 0 state. Upon the input signal IN being logic 0 and at a positive pulse of the pulsed clock signal PCK, the N-FETs 106 and 112 are activated to couple the storage node 1166 to ground, resulting in the first output signal Q1 having a logic 0 state with the complement of the first output signal Q1' having a logic 1 state.

The first output signal Q1 can be input to a first delay element 126 and a first pass-gate element 128. The first delay element 126 provides a first delay signal D1 that is a delayed version of the first output signal Q1. The first delay element 126 could include an arrangement of gates substantially similar to the delay element 90 in the example of FIG. 5, thus providing the delay signal D1 that is forced to a stable logic 1 state upon the first output signal Q1 having a metastable state. In the example of FIG. 6, the first delay element 126 is demonstrated as forcing the first delay signal D1 to a logic 1 state upon the first output signal Q1 being switched from a logic 0 state to a metastable state. The joint operation of first delay element 126 and the first pass-gate element 128 can be substantially similar to that described above in the example of FIG. 4 to provide the second output signal P1 that is substantially stable. In addition, the first delay element 126 can include an activation signal ON1, such that a logic 0 state of the activation signal ON1 can result in a logic 0 state of the first delay signal D1, regardless of the state of the first output signal Q1.

Synchronizing a falling edge of the input signal IN is actually synchronizing a rising edge of the inverted input signal IN'. As such, the inverted first output signal Q1' can be input to a second delay element 134 and a second pass-gate element 136. The second delay element 134 provides a delay signal D0, the delay signal D0 being a delayed version of the inverted first output signal Q1'. The second delay element 134 could include an arrangement of gates substantially similar to the delay element 90 in the example of FIG. 5, thus providing the delay signal D0 having a logic 1 state upon the inverted first output signal Q1' being switched from a logic 0 state to a metastable state. The joint operation of second delay element 134 and the second pass-gate element 136 can be substantially similar to that described above in the example of FIG. 4 to provide the inverted second output signal P1' that is substantially stable. In addition, the second delay element 134 can include an activation signal ON0, such that a logic 0 state of the activation signal ON0 can result in a logic 0 state of the delay signal D0, regardless of the state of the inverted first output signal Q1'.

As described above, when the system 100 synchronizes the rising edge of the input signal IN, the input signal IN is latched as the first output signal Q1 from the pulse latch 102, and the first output signal Q1 is output from the pass-gate element 128 as the second output signal P1. This signal path will be hereafter referred to as the IN channel. When the system 100 synchronizes the rising edge of the inverted input signal IN', the inverted input signal IN' is latched as the inverted first output signal Q1' from the pulse latch 102, and the inverted first output signal Q1' is output from the pass-gate element 136 as the inverted second output signal P1'. This signal path will be hereafter referred to as the IN' channel.

The system 100 also includes a channel selection circuit 142 that allows the system 100 to synchronize both a rising edge of an input signal and a falling edge of the input signal by synchronizing the rising edge of the signal and synchronizing the rising edge of the complement of the signal. The channel selection circuit 142 receives the first output signal Q1 and the inverted first output signal Q1' as inputs. The first output signal Q1 is input to both an inverter 144 and a NAND gate 146. The NAND gate 146 provides an input to a NAND gate 148. The NAND gate 148 also receives the activation signal ON0 as an input and outputs the activation signal ON1. The inverted first output signal Q1' is input to both an inverter 150 and a NAND gate 152. The NAND gate 152 provides an input to a NAND gate 154. The NAND gate 154 also receives the activation signal ON1 as an input and outputs the activation signal ON0. Thus, in the example of FIG. 6, the NAND gates 148 and 154 are demonstrated to be substantially configured as an SR latch. However, it is to be understood that any of a variety of logic circuits can be implemented in the channel selection circuit 142 in the example of FIG. 6.

In a steady state condition, at a given time, one of the activation signals ON1 and ON0 is at a logic 1 state. Thus, the respective one of the delay elements 126 and 134 is activated at a given time, thus providing a respective delay signal D1 and D0. As is demonstrated in the example of FIG. 6, upon a rising edge of the first output signal Q1, the inverter 144 and the NAND-gate 146 provide a logic 0 pulse. The logic 0 pulse input to the NAND-gate 148 provides a logic 1 output from the NAND-gate 148, thus activating the delay element 106. Likewise, upon a rising edge of the inverted first output signal Q1', the inverter 150 and the NAND-gate 152 provide a logic 0 pulse. The logic 0 pulse input to the NAND-gate 154 provides a logic 1 output from the NAND-gate 154, thus activating the delay element 134. Thus, the channel selection circuit 142 switches between the IN channel and the IN' channel upon a rising edge of the respective one of first output signal Q1 and the inverted first output signal Q1'.

In the event that the first output signal Q1 or the inverted first output signal Q1' transitions from a logic 0 to a short metastable state that subsequently settles back to a logic 0 state, such as demonstrated in the example of FIG. 3 above, the channel selection circuit 142 may provide unpredictable logic states of the activation signals ON1 and ON0. However, the system 100 may be configured to be unaffected by such a transition. For example, when synchronizing a rising edge of the input signal IN, a short metastable state resolving to 0 may cause a short positive pulse on the first output signal Q1, which may provide an uncertain value on the activation signals ON1 and ON0. For this case, the delay signal D1 will be 0 at the next latching time due to the input to the delay element 106 being 0, as the output of the delay element 106 is ANDed with the incoming signal and the delay element 106 has a quick reset, such as demonstrated in the example of FIG. 5. A short pulse that day cause any signal value will likewise not affect the IN' channel. As an example, during a previous latching cycle, the inverted second output signal P1' had already pulled the next latch's storage node, such as similar to the storage node 112 of the pulse latch 102, to a logic 0 state. Therefore, it does not matter whether the next latch's storage node is pulled down again or not, since it is already at a logic 0 state.

It is to be understood that the system 100 is not intended to be limited by the example of FIG. 6. For example, other synchronization configurations can be utilized in the system 100. As an example, the pulsed latch 102 can be any of a variety of condition controlled latches and/or flip-flops. As another example, the inverters 122 and 124 can include an N-FET and P-FET pair having dissimilar activation strengths. Such a configuration can be instead of or in addition to such a configuration in the delay elements 126 and 134 and/or the inverters 144 and 150, such that the first output signal Q1 and the inverted first output signal Q1' can be output from the pulsed latch 102 as having been forced from a metastable state to a substantially stable state. Furthermore, additional logic circuitry can be included in the system 100, such that the additional logic circuitry works in conjunction with the synchronization of the input signal IN. As such, any of a variety of other combinations of logic devices can be included in the example of FIG. 6.

Figure 7:
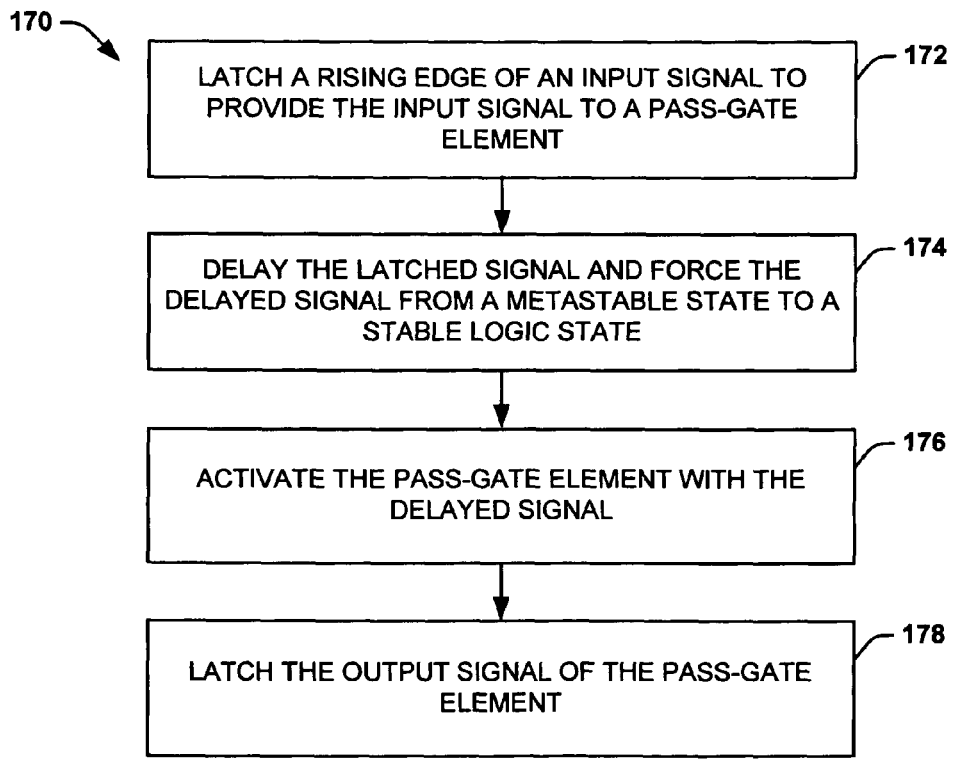
FIG. 7 is a flow diagram depicting an example embodiment of a method for synchronizing an input signal.
Figure 8:
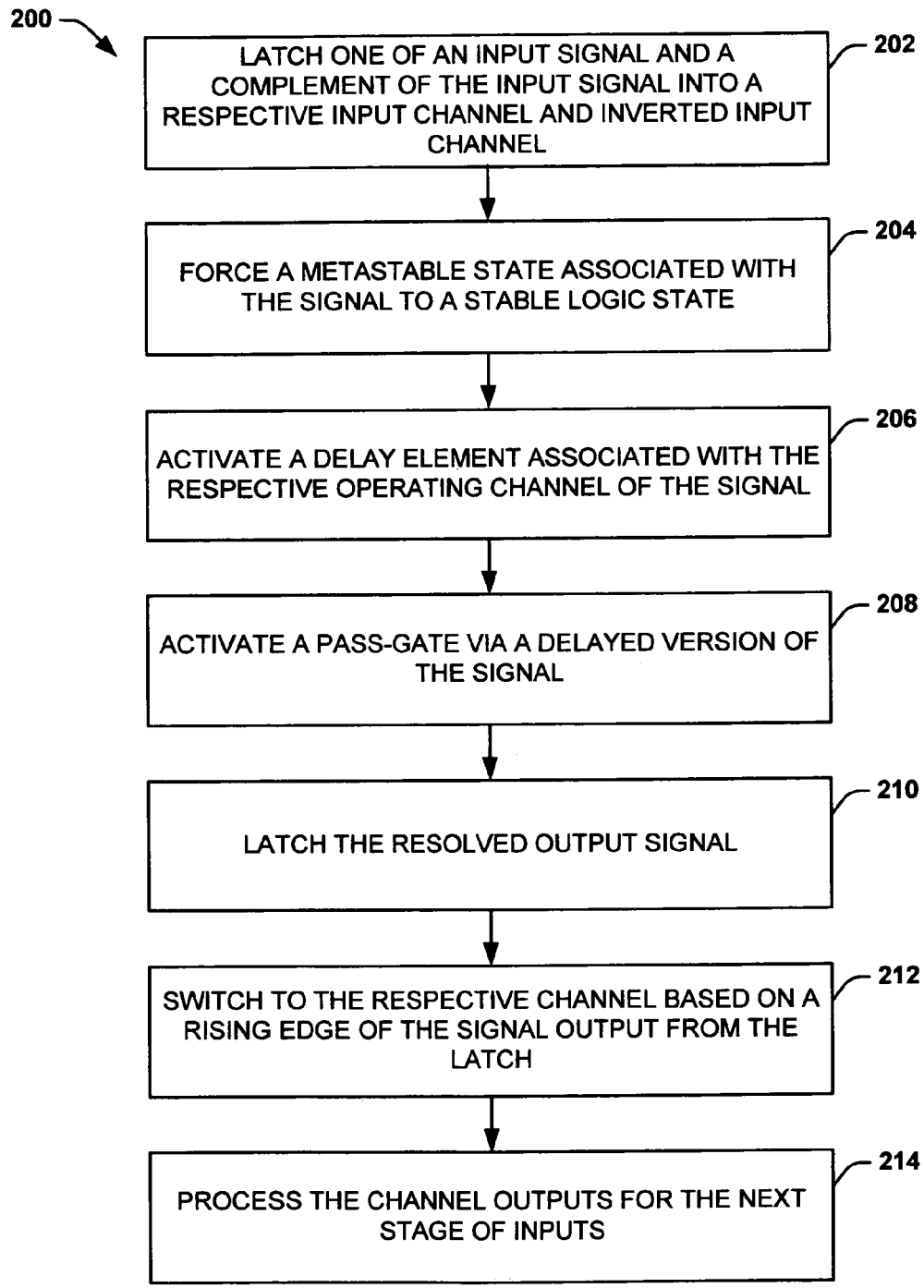
FIG. 8 is another flow diagram depicting an example embodiment of a method for synchronizing an input signal.

In view of the foregoing structural and functional features described above, certain methods will be better appreciated with reference to FIGS. 7 and 8. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g. a computer or a computer network); software (e.g., as executable instructions running on one or more computer systems), or any combination of hardware and software.

FIG. 7 illustrates a method 170 for synchronizing a rising edge of an input signal. At 172, a rising edge of an input signal is latched to provide the input signal to a pass-gate element. At 174, the latched output is delayed and forced from a metastable state to a stable logic state. At 176, the pass-gate element is activated by the delayed signal. The output from the pass-gate element is a delayed version of the input signal rising edge while the resolving edge is not delayed. As such, race conditions can be substantially mitigated and resolving time is substantially increased. At 178, the output signal of the pass-gate is latched.

FIG. 8 illustrates a method 200 for synchronizing both edges of an input signal. At 202, one of an input signal and a complement of an input signal is latched into a respective input channel and inverted input channel. The input signal and the/or the complement of the input signal can be latched by a pulsed latch, such as via a pulse clock signal. The signal can be latched such as at a rising edge of the input signal or a rising edge of the complement of the input signal, corresponding to synchronization of the falling edge of the input signal. At 204, a metastable state associated with the signal is forced to a stable logic state. The metastable state could be forced to a stable logic 0 or logic 1 state based on an inverter having an N-FET and P-FET pair having dissimilar activation strengths. The inverter can be an output inverter of the pulsed latch or can be an inverter included in a delay element.

At 206, a delay element associated with the respective operating channel of the signal is activated. The operating channel can be associated with either the input signal or the complement of the input signal. The switching between the channels to activate the respective delay element can be based on an SR-latch configured to switch to the appropriate operating channel based on a rising edge transition of the signal on the appropriate operating channel. At 208, a pass-gate is activated via a delayed version of the stable state signal. The output signal can be the input signal or the complement of the input signal after having resolved to a stable state, such that both edges of the input signal are synchronized. As such, the delay element prevents a race condition from occurring, and the pass-gate prevents the resolving edge of the metastable signal from being delayed, as well. Therefore, a delayed signal that does not include a resolving edge for resolving to either a logic 0 state or a logic 1 state can be latched by a subsequent latching device. Accordingly, the Metastable Resolving Time Tr of the associated synchronizer system is increased. At 210, the resolved output signal is latched.

At 212, the respective channel is switched based on a rising edge of the signal output from the latch. A rising edge transition of the input signal activates the input channel, and a rising edge transition of the inverted input signal activates the inverted input channel. At 214, the channel outputs are processed for the next stage of inputs.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for synchronizing an input signal, the system comprising:
   a first latching device configured to latch an input signal;
   a second latching device configured to latch an output signal; and
   a synchronizer transition element interconnected between the first latching device and the second latching device and configured to provide substantial race condition prevention and increased resolving time based on delaying an edge of the input signal without delaying a resolving edge of a metastable condition associated with the input signal, such that the resolving edge does not appear at the second latching device for both resolving to a logic 1 state and a logic 0 state;
   wherein the synchronizer transition element comprises a channel switching circuit configured to switch between an input channel and a complementary input channel based on a logic state transition of the latched input signal.

2. A system for synchronizing an input signal, the system comprising:
   a first latching device configured to latch an input signal;
   a second latching device configured to latch an output signal; and
   a synchronizer transition element interconnected between the first latching device and the second latching device and configured to provide substantial race condition prevention and increased resolving time based on delaying an edge of the input signal without delaying a resolving edge of a metastable condition associated with the input signal, such that the resolving edge does not appear at the second latching device for both resolving to a logic 1 state and a logic 0 state;
   wherein the synchronizer transition element comprises a delay element and a pass-gate element, the delay element providing a delayed version of the input signal that is forced to a stable logic state in response to the metastable condition associated with the input signal, and the pass-gate element providing the output signal in response to being activated by the delayed version of the input signal.

3. The system of claim 2, wherein at least one of the delay element and the first latching device comprises at least one inverter comprising an N-type field-effect transistor (FET) and a P-FET having dissimilar activation strength to force the output signal to the stable logic state in response to the output signal having the metastable state.

4. A system for synchronizing an input signal, the system comprising:
   a first latching device configured to latch a first output signal from an input signal;

a first delay element configured to receive the first output signal and to output a delay signal that is a delayed version of the first output signal;

a first pass-gate element configured to receive the first output signal and to output a second output signal in response to a logic state of the delay signal;

wherein the system is configured to force the first output signal to a stable logic state in response to the first output signal having a metastable state;

a second delay element configured to receive an inverted first output signal and to output an inverted delay signal that is a delayed version of the inverted first output signal; and a second pass-gate element configured to receive the inverted first output signal and to output an inverted second output signal in response to a logic state of the inverted delay signal;

wherein the first pass-gate element and the first delay element constitute a first channel and wherein the second pass-gate element and the second delay element constitute a second channel.

5. The system of claim 4, further comprising a channel switching system configured to switch to the first channel upon a logic state transition of the first output signal, such that the first delay element is activated and the second delay element is deactivated, and configured to switch to the second channel upon the same logic state transition of the inverted first output signal, such that the second delay element is activated and the first delay element is deactivated.

6. The system of claim 5, wherein the switching system comprises an SR latch.

7. The system of claim 4, wherein at least one of the first delay element, the second delay element, the first latching device and the second latching device comprises at least one inverter comprising an N-type field-effect transistor (FET) and a P-FET having dissimilar activation strength to force the first output signal to the stable logic state in response to the first output signal having the metastable state.

8. The system of claim 4, wherein at least one of the first and second pass-gate elements comprises an N-type field-effect transistor (FET), a P-FET, and an inverter, the N-FET having a drain terminal coupled to the first output signal and a drain terminal of the P-FET, a source terminal coupled to a source terminal of the P-FET, and the inverter being configured to provide an inverted delay signal, such that the N-FET and the P-FET are each activated by one of the delay signal and the inverted delay signal.

9. The system of claim 8, wherein the system is configured to force the first output signal to a logic 1 state in response to the first output signal switching from a logic 0 state to a metastable state, such that the first pass-gate element is configured to be activated by the first delay signal having a logic 1 state, and wherein the first pass-gate element further comprises a transistor interconnected between the second output signal and a negative supply voltage rail and being configured to couple the second output signal to the negative supply voltage rail based upon a logic 1 state of the inverted delay signal.

10. The system of claim 8, wherein the system is configured to force the first output signal to a logic 0 state in response to the first output signal switching from a logic 1 state to a metastable state, such that the first pass-gate element is configured to be activated by the delay signal having a logic 0 state, and wherein the first pass-gate element further comprises a transistor interconnected between the second output signal and a positive supply voltage rail and being configured to couple the second output signal to the positive supply voltage rail based upon a logic 0 state of the inverted delay signal.

11. A system for synchronizing an input signal, the system comprising:

a first latching device configured to latch a first output signal from an input signal;

a delay element configured to receive the first output signal and to output a delay signal that is a delayed version of the first output signal;

a pass-gate element configured to receive the first output signal and to output a second output signal in response to a logic state of the delay signal; and wherein the system is configured to force the first output signal to a stable logic state in response to the first output signal having a metastable state;

wherein the delay element is configured to delay a logic 1 by a first delay amount and to delay a logic 0 by a second delay amount, the first delay amount being different from the second delay amount.

12. A method for synchronizing an input signal, the method comprising:

latching an input signal at a first latching device to provide a first output signal;

delaying the first output signal;

controlling, by a logic state of the delayed first output signal, a pass-gate that receives the first output signal, thereby forcing the first output signal to a stable logic state in response to the first output signal having a metastable state; and latching the first output signal at a second latching device;

wherein the delaying the first output signal comprises delaying the first output signal by a first amount of time upon the first output signal being logic 1 and by a second amount of time upon the first output signal being logic 0, the first amount of time being different than the second amount of time.

13. The method of claim 12, further comprising:

propagating the first output signal through the pass-gate element to the second latching device.

14. The method of claim 13, further comprising coupling the output of the pass-gate element to one of a positive supply voltage rail and a negative supply voltage rail based on a logic state of the delayed first output signal to provide one of a logic 1 state and a logic 0 state, respectively, of the propagated first output signal upon the pass-gate element being deactivated.

15. A method for synchronizing an input signal, the method comprising:

latching an input signal at a first latching device to provide a first output signal;

forcing the first output signal to a stable logic state in response to the first output signal having a metastable state;

delaying the first output signal;

latching the first output signal at a second latching device;

latching an inverted input signal at the first latching device to provide an inverted first output signal;

forcing the inverted first output signal to a stable logic state in response to the inverted first output signal having a metastable state;

delaying the inverted first output signal; and latching the inverted first output signal at the second latching device.

16. The method of claim 15, further comprising:

switching to a first channel upon a logic state transition of the first output signal, the switching to the first channel comprising activating the delaying of the first output signal and deactivating the delaying of the inverted first output signal; and switching to a second channel upon the same logic state transition of the inverted first output signal, the switching to the second channel comprising activating the delaying of the inverted first output signal and deactivating the delaying of the first output signal.

17. A system comprising:

means for latching an input signal to provide a first signal;

means for forcing the first signal to a stable logic state upon the first signal having a metastable state;

means for delaying the first signal;

means for providing a second signal based on the first signal and the delayed first signal;

means for latching the second signal;

means for coupling the second signal to one of a positive supply voltage rail and a negative supply voltage rail based on a logic state of the delayed first signal to provide one of a logic 1 state and a logic 0 state, respectively, of the first signal upon the means for providing the second signal being deactivated;

means for latching an inverted input signal to provide an inverted first signal;

means for forcing the inverted first signal to a stable logic state upon the inverted first signal having a metastable state;

means for delaying the inverted first signal;

means for providing an inverted second signal based on the inverted first signal and the delayed inverted first signal; and means for latching the inverted second signal.

18. The system of claim 17, wherein the means for delaying the first signal comprises means for delaying the first signal by a first amount of time upon the first signal being logic 1 and by a second amount of time upon the first signal being logic 0, the first amount of time being different than the second amount of time.

19. The system of claim 17, further comprising means for switching to a first channel upon a logic state transition of the first signal and to a second channel upon the same logic state transition of the inverted first signal, wherein switching to the first channel comprises activating the means for delaying the first signal and deactivating the means for delaying the inverted first signal, and wherein switching to the second channel comprises activating the means for delaying the inverted first signal and deactivating the means for delaying the first signal.

* * * * *